United States Patent
Hu et al.

(10) Patent No.: US 9,496,374 B2
(45) Date of Patent: Nov. 15, 2016

(54) METHOD FOR MANUFACTURING THIN-FILM TRANSISTOR SUBSTRATE

(71) Applicant: Shenzhen China Star Optoelectronics Technology Co., Ltd., Shenzhen, Guangdong (CN)

(72) Inventors: Zhe Hu, Shenzhen (CN); Yuting Chen, Shenzhen (CN);
(Continued)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 29 days.

(21) Appl. No.: 14/345,931

(22) PCT Filed: Jan. 13, 2014

(86) PCT No.: PCT/CN2014/070507
§ 371 (c)(1),
(2) Date: Mar. 19, 2014

(87) PCT Pub. No.: WO2015/100791
PCT Pub. Date: Jul. 9, 2015

(65) Prior Publication Data
US 2015/0200274 A1 Jul. 16, 2015

(30) Foreign Application Priority Data
Dec. 31, 2013 (CN) .......................... 2013 1 0754071

(51) Int. Cl.
*H01L 29/66* (2006.01)
*H01L 27/12* (2006.01)
*H01L 29/786* (2006.01)

(52) U.S. Cl.
CPC ..... *H01L 29/66969* (2013.01); *H01L 27/1225* (2013.01); *H01L 29/7869* (2013.01)

(58) Field of Classification Search
CPC ................... H01L 29/66742; H01L 29/66969
(Continued)

(56) References Cited
U.S. PATENT DOCUMENTS

| 2011/0108831 A1* | 5/2011 | Jeong | H01L 27/3248 257/43 |
| 2011/0140103 A1* | 6/2011 | Lee | H01L 27/1214 257/43 |

(Continued)

FOREIGN PATENT DOCUMENTS

| CN | 1828886 A | 9/2006 |
| CN | 101419916 A | 4/2009 |
| CN | 101901768 A | 12/2010 |

*Primary Examiner* — Julio J Maldonado
*Assistant Examiner* — Cory Eskridge
(74) *Attorney, Agent, or Firm* — Andrew C. Cheng

(57) ABSTRACT

The present invention provides a method for manufacturing a thin-film transistor substrate, which has a simple process and achieves an excellent contact interface between an oxide semiconductor layer and source/drain terminals through successive film forming so as to prevent crowding effect resulting from excessive contact resistance. Further, by using a metallic material containing tantalum to make the source/drain terminals and applying an etchant solution containing hydrogen peroxide to carry out etching in an etching process of the source/drain terminals, damages of the oxide semiconductor layer caused by traditional etchant solution can be prevented and quality of the thin-film transistor substrate can be enhanced. Further, it is not necessary to additionally form an etch stopper layer to protect the oxide semiconductor layer in the back channel so as to achieve relatively high channel width/length ratio (W/L), and also simplify the structure of the thin-film transistor substrate, simplify the manufacturing process, reduce the manufacturing cost, and enhance yield rate.

13 Claims, 7 Drawing Sheets

(72) Inventors: Runze Zhan, Shenzhen (CN);
Chengyuan Dong, Shenzhen (CN);
Chenglung Chiang, Shenzhen (CN);
Polin Chen, Shenzhen (CN); Tzuchieh Lai, Shenzhen (CN)

(58) Field of Classification Search
USPC .......................................................... 438/104
See application file for complete search history.

(56) References Cited

U.S. PATENT DOCUMENTS

2013/0032793 A1\* 2/2013 Kim .................... H01L 29/7869
257/43
2014/0151682 A1\* 6/2014 Saito ................. H01L 21/32134
257/43

\* cited by examiner

METHOD FOR MANUFACTURING THIN-FILM TRANSISTOR SUBSTRATE

BACKGROUND OF THE INVENTION

1. Field of the Invention

The present invention relates to the field of liquid crystal displaying, and in particular to a method for manufacturing a thin-film transistor (TFT) substrate.

2. The Related Arts

Thin-film transistors (TFTs) are widely used in electronic devices as switching devices and driving devices. Specifically, since the thin-film transistors can be formed on a glass substrate or a plastic substrate, they are often used in the fields of flat panel displays including liquid crystal displays (LCDs), organic light-emitting displays (OLEDs), electrophoretic displays (EPDs).

Oxide semiconductors have a relatively high electron mobility (the electron mobility of oxide semiconductors >10 $cm^2/Vs$, while the mobility of amorphous silicon (a-Si) being only 0.5-0.8 $cm^2/Vs$). Further, the manufacturing process of oxide semiconductors is simple as compared to that of low-temperature poly-silicon and is compatible with that of amorphous silicon, allowing it to be applied to various fields including liquid crystal displays, organic light-emitting displays, and flexible displays and compatible with high generation manufacturing lines to be applicable to large-, medium-, and small-sized displays, having a prosperous future of application and being a hot spot of current researches.

Heretofore, the commonly seen oxide semiconductor thin-film transistors include: etch stopper based oxide semiconductor thin-film transistor and back channel etching based oxide semiconductor thin-film transistor.

Referring to FIG. 1, which is a schematic view showing the structure of a conventional etch stopper based oxide semiconductor thin-film transistor, an etch stopper layer (ESL) 300 is formed after an oxide semiconductor layer 100 is formed but before a metal source/drain electrode 200 is formed to protect the oxide semiconductor layer 100 in a back channel from damage caused in the subsequent processes (such as processes including etching of the metal source/drain electrode 200 and exposure of passivation layer 500) so as to enhance stability of the oxide semiconductor thin-film transistor. However, additionally making the etch stopper layer requires an additional photolithographic process and a photolithographic process includes steps of film formation, exposure, development, etching, and peeling. Thus, additionally making an etch stopper layer would greatly increase the manufacturing cost and lower yield rate.

To cope with these problems, a back channel etching based oxide semiconductor thin-film transistor omits the etch stopper layer formed on the oxide semiconductor layer in order to reduce the photolithographic processes and lower down the manufacturing cost.

Referring to FIG. 2, which is a schematic view showing the structure of a conventional back channel etching based oxide semiconductor thin-film transistor, after an oxide semiconductor layer 100' is formed, a metal source/drain electrode 200' is directly formed thereon and then a passivation layer 500' is formed on the metal source/drain electrode 200'.

Such a back channel etching based oxide semiconductor thin-film transistor, although having a simple structure and manufacturing process and having a relatively large channel width/length (W/L) ratio, the etching process of the metal source/drain electrode 200' often uses strong acids and mixtures thereof (such as $HNO_3/H_3PO_4/CH_3COOH$) as etchants. This readily leads to damages of the oxide semiconductor layer 100' in the back channel and deterioration and instability of the oxide semiconductor thin-film transistor may result.

SUMMARY OF THE INVENTION

An object of the present invention is to provide a method for manufacturing a thin-film transistor substrate, which is a simple method and simplifies the manufacturing process, reduces manufacturing costs, enhances yield rate, and a thin-film transistor substrate so manufactured has a simple structure and requires no additional etch stopper layer so as to achieve relatively high channel width/length ratio (W/L) and prevent crowding effect resulting from excessive contact resistance and damages of the oxide semiconductor layer caused by traditional etchant solutions thereby enhancing the quality of the thin-film transistor substrate.

To achieve the above object, the present invention provides a method for manufacturing a thin-film transistor substrate, which comprises the following steps:

(1) providing a substrate;

(2) forming a first metal layer on the substrate and patterning the first metal layer to form a gate terminal;

(3) forming a gate insulation layer on the gate terminal and the substrate;

(4) successively forming films on the gate insulation layer to sequentially form an oxide semiconductor layer and a second metal layer and patterning the second metal layer to form source/drain terminal, wherein the second metal layer comprises tantalum;

(5) patterning the oxide semiconductor layer to expose a portion of the gate insulation layer;

(6) forming a passivation layer on the source/drain terminal, the oxide semiconductor layer, and the gate insulation layer and patterning the passivation layer to expose a portion of the source/drain terminals and a portion of the oxide semiconductor layer; and (7) forming a transparent conductive layer on the passivation layer and the exposed portion of the source/drain terminals and patterning the transparent conductive layer to form the pixel electrode.

The substrate is a transparent substrate.

The substrate is a glass substrate.

The first metal layer comprises at least one of copper, tantalum, aluminum, and molybdenum.

The second metal layer further comprises as least one of copper, aluminum, and molybdenum.

In step (4), an etchant solution comprising hydrogen peroxide is applied to subject the second metal layer to etching in order to achieve the patterning of the second metal layer.

The etchant solution comprises hydrogen peroxide having a concentration greater than 5 wt % and less than 30 wt %.

The oxide semiconductor layer comprises at least one of indium oxide, zinc oxide, tin oxide, and gallium oxide.

The transparent conductive layer comprises indium tin oxide and the gate insulation layer and the passivation layer comprises silicon oxide.

The present invention also provides a method for manufacturing a thin-film transistor substrate, which comprises the following steps:

(1) providing a substrate;

(2) forming a first metal layer on the substrate and patterning the first metal layer to form a gate terminal;

(3) forming a gate insulation layer on the gate terminal and the substrate;

(4) successively forming films on the gate insulation layer to sequentially form an oxide semiconductor layer and a second metal layer and patterning the second metal layer to form source/drain terminal, wherein the second metal layer comprises tantalum;

(5) patterning the oxide semiconductor layer to expose a portion of the gate insulation layer;

(6) forming a passivation layer on the source/drain terminal, the oxide semiconductor layer, and the gate insulation layer and patterning the passivation layer to expose a portion of the source/drain terminals and a portion of the oxide semiconductor layer; and (7) forming a transparent conductive layer on the passivation layer and the exposed portion of the source/drain terminals and patterning the transparent conductive layer to form the pixel electrode;

wherein the substrate is a transparent substrate;
wherein the substrate is a glass substrate; and
wherein the first metal layer comprises at least one of copper, tantalum, aluminum, and molybdenum.

The second metal layer further comprises as least one of copper, aluminum, and molybdenum.

In step (4), an etchant solution comprising hydrogen peroxide is applied to subject the second metal layer to etching in order to achieve the patterning of the second metal layer.

The etchant solution comprises hydrogen peroxide having a concentration greater than 5 wt % and less than 30 wt %.

The oxide semiconductor layer comprises at least one of indium oxide, zinc oxide, tin oxide, and gallium oxide.

The transparent conductive layer comprises indium tin oxide and the gate insulation layer and the passivation layer comprises silicon oxide.

The efficacy of the present invention is that the present invention provides a method for manufacturing a thin-film transistor substrate, which has a simple process and achieves an excellent contact interface between an oxide semiconductor layer and source/drain terminals through successive film forming so as to prevent crowding effect resulting from excessive contact resistance. Further, by using a metallic material containing tantalum to make the source/drain terminals and applying an etchant solution containing hydrogen peroxide to carry out etching in an etching process of the source/drain terminals, damages of the oxide semiconductor layer caused by traditional etchant solution can be prevented and quality of the thin-film transistor substrate can be enhanced. Further, it is not necessary to additionally form an etch stopper layer to protect the oxide semiconductor layer in the back channel so as to achieve relatively high channel width/length ratio (W/L), and also simplify the structure of the thin-film transistor substrate, simplify the manufacturing process, reduce the manufacturing cost, and enhance yield rate.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
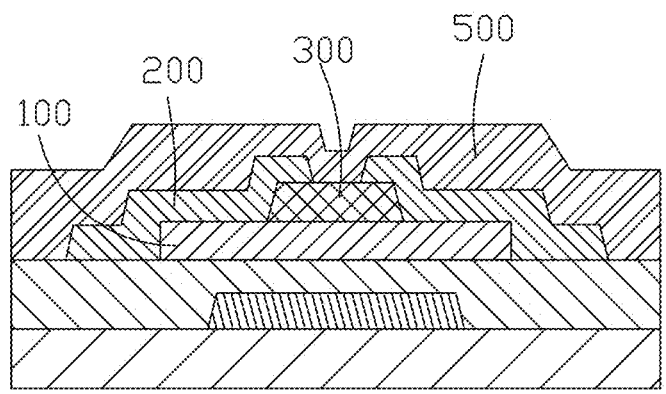
FIG. 1 is a schematic view showing the structure of a conventional etch stopper based oxide semiconductor thin-film transistor.
Figure 2:
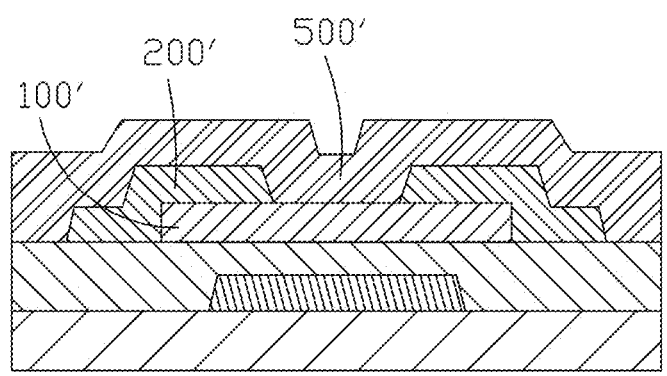
FIG. 2 is a schematic view showing the structure of a conventional back channel etching based oxide semiconductor thin-film transistor.
Figure 3:
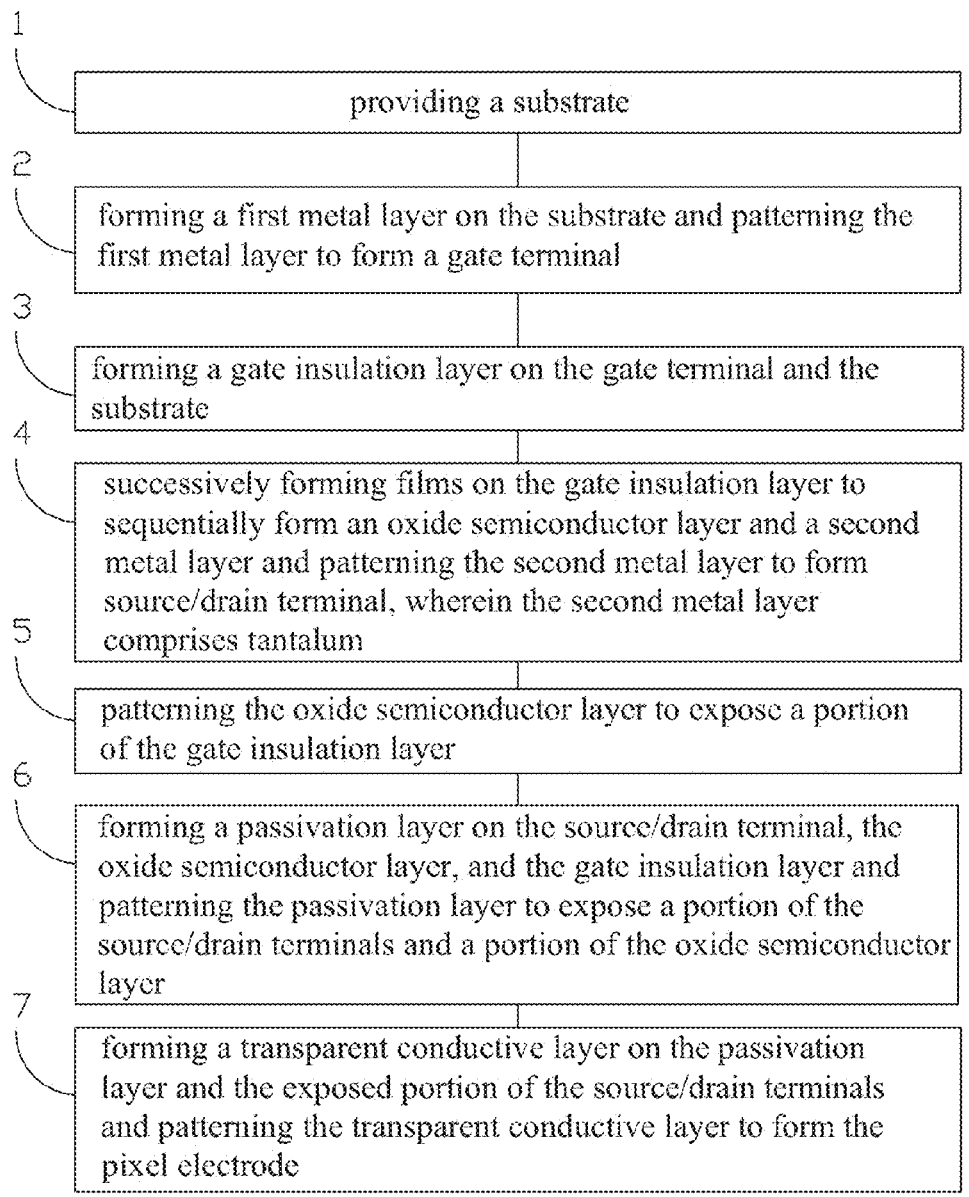
FIG. 3 is a flow chart illustrating a method for manufacturing a thin-film transistor substrate according to the present invention.
Figure 4:
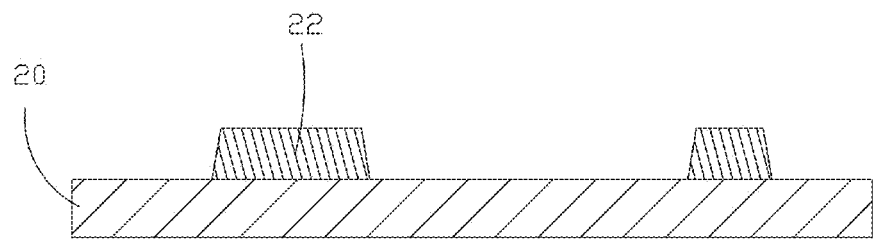
FIGS. 4-9 are schematic views illustrating the process of manufacturing the thin-film transistor according to the present invention.
Figure 5:
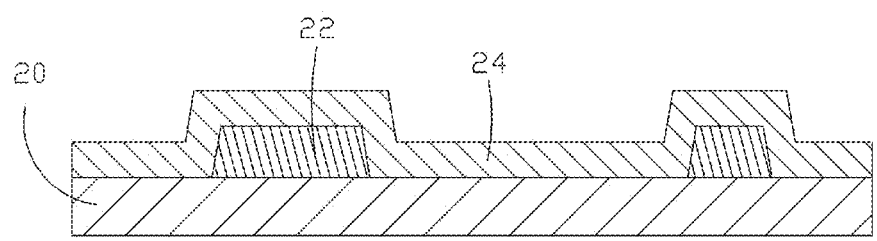
Figure 6:
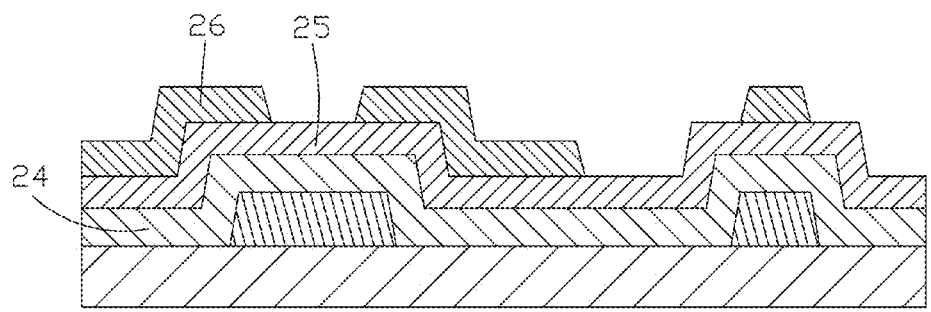
Figure 7:
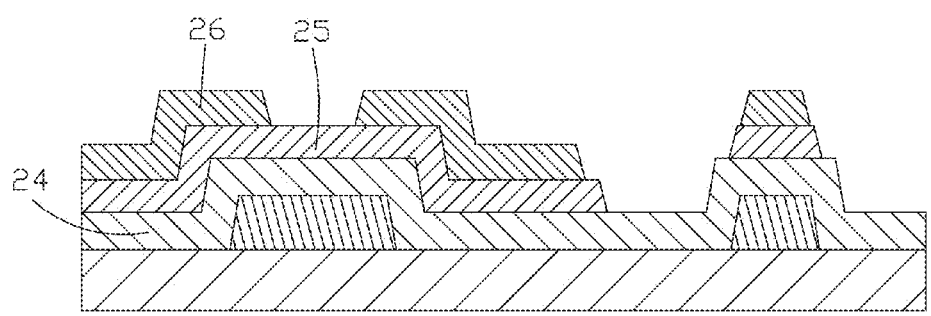
Figure 8:
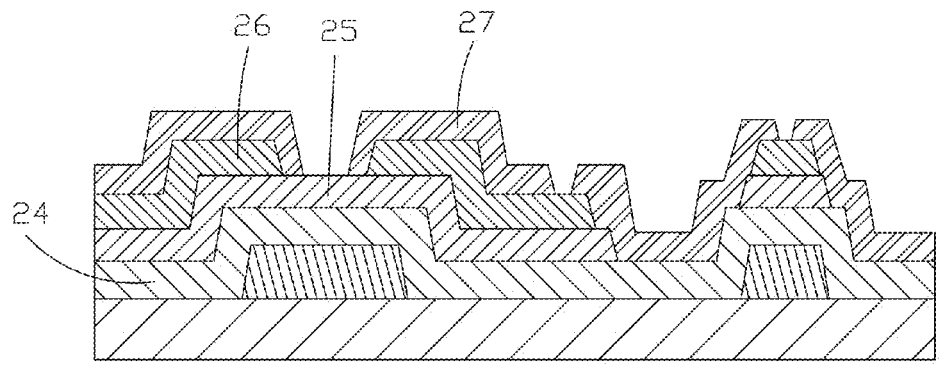
Figure 9:
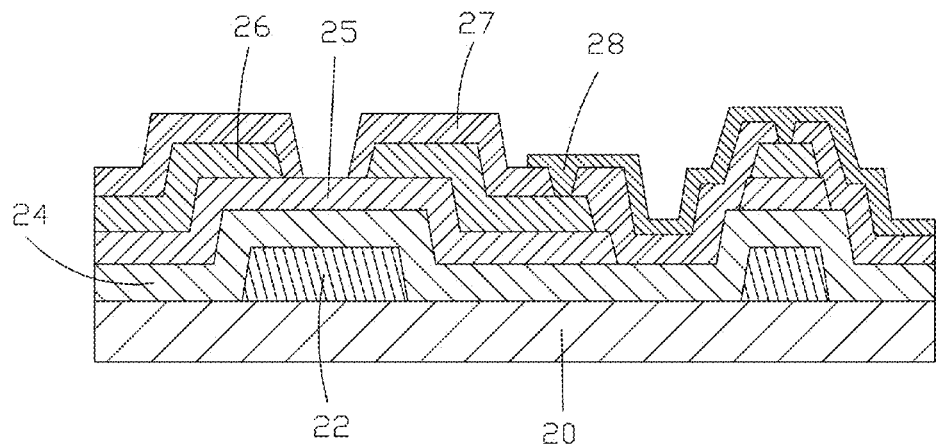

Referring to FIG. 3, with additional reference to FIGS. 4-9, the present invention provides a method for manufacturing a thin-film transistor substrate, which comprises the following steps:

Step 1: providing a substrate 20.

The substrate 20 is a transparent substrate, preferably a glass substrate or a plastic substrate. In the instant embodiment, the substrate 20 is a glass substrate.

Step 2: forming a first metal layer on the substrate 20 and patterning the first metal layer to form a gate terminal 22.

Specifically, the first metal layer is formed on the substrate 20 through deposition and then the first metal layer is subjected to exposure, development, and etching by using masks or half-masks to form a gate terminal 22 of a predetermined pattern. The first metal layer comprises at least one of copper, tantalum, aluminum, and molybdenum. In other words, the gate terminal 22 comprises at least one of copper, tantalum, aluminum, and molybdenum.

Step 3: forming a gate insulation layer 24 on the gate terminal 22 and the substrate 20.

The gate insulation layer 24 is formed by means of deposition. The gate insulation layer 24 generally comprises one of silicon oxide and silicon nitride or a combination thereof.

Step 4: successively forming films on the gate insulation layer 24 to sequentially form an oxide semiconductor layer 25 and a second metal layer and patterning the second metal layer to form source/drain terminals 26.

Specifically, after films are successively formed to form the oxide semiconductor layer 25 and the second metal layer, the second metal layer is subjected to exposure, development, and etching by using masks or half-masks to form the source/drain terminals 26 of a predetermined pattern. During the process of etching, an etchant solution that comprises hydrogen peroxide is used to carry out etching of the second metal layer in order to achieve patterning of the second metal layer. This forms an excellent interface between the oxide semiconductor layer 25 and the source/drain terminals 26 so as to ensure excellent contact between the oxide semiconductor layer 25 and the source/drain terminals 26, preventing crowding effect resulting from excessively large contact resistance. The oxide semiconductor layer 25 comprises at least one of indium oxide, zinc oxide, tin oxide, and gallium oxide. In the instant embodiment, the oxide semiconductor layer 25 is an indium gallium zinc oxide (InGaZnO, IGZO) semiconductor layer.

In the instant embodiment, the second metal layer comprises tantalum. In other words, the source/drain terminals 26 comprise tantalum. Further, the second metal layer also comprises at least one of copper, aluminum, and molybdenum. In other words, the source/drain terminal 26 further includes at least one of copper, aluminum, and molybdenum in the basic metal material of tantalum.

Hydrogen peroxide ($H_2O_2$) shows apparent selectivity over tantalum and indium gallium zinc oxide. In other words, an etchant solution containing hydrogen peroxide has an apparent effect of etching on tantalum but shows no etching on indium gallium zinc oxide. Thus, using an etchant solution containing hydrogen peroxide to carry out etching on the second metal layer effectively prevents the potential risk of damaging the oxide semiconductor layer 25 resulting from the use of the traditional etchant solution, enhances the quality of the thin-film transistor substrate, requires no formation of an additional etch stopper layer to protect the oxide semiconductor layer 25 in a back channel so as to achieve relatively high channel width/length ratio (W/L), and also simplify the structure of the thin-film transistor substrate, simplify the manufacturing process, reduce the manufacturing cost, and enhance yield rate.

It is noted that the enchant solution that contains hydrogen peroxide preferably contains hydrogen peroxide having a concentration greater than 5 wt % but smaller than 30 wt % in order to carry out etching on the second metal layer in a complete and efficient manner.

Step 5: patterning the oxide semiconductor layer 25 to expose a portion of the gate insulation layer 24.

Specifically, after the source/drain terminals 26 are formed, the oxide semiconductor layer 25 is subjected to exposure, development, and etching by using masks or half-masks to form a predetermined pattern of the oxide semiconductor layer 25 for exposing a portion of the gate insulation layer 24.

Step 6: forming a passivation layer 27 on the source/drain terminal 26, the oxide semiconductor layer 25, and the gate insulation layer 24 and patterning the passivation layer 27 to expose a portion of the source/drain terminals 26 and a portion of the oxide semiconductor layer 25.

The passivation layer 27 generally comprises one of silicon oxide and silicon nitride or a combination thereof and the process of formation thereof is similar to that of the gate terminal 22 so that repeated description will be omitted here.

Step 7: forming a transparent conductive layer on the passivation layer 27 and the exposed portion of the source/drain terminals 26 and patterning the transparent conductive layer to form the pixel electrode 28.

The transparent conductive layer is preferably made of indium tin oxide and the process of formation thereof is similar to that of the gate terminal 22 so that repeated description will be omitted here.

Figure 10:
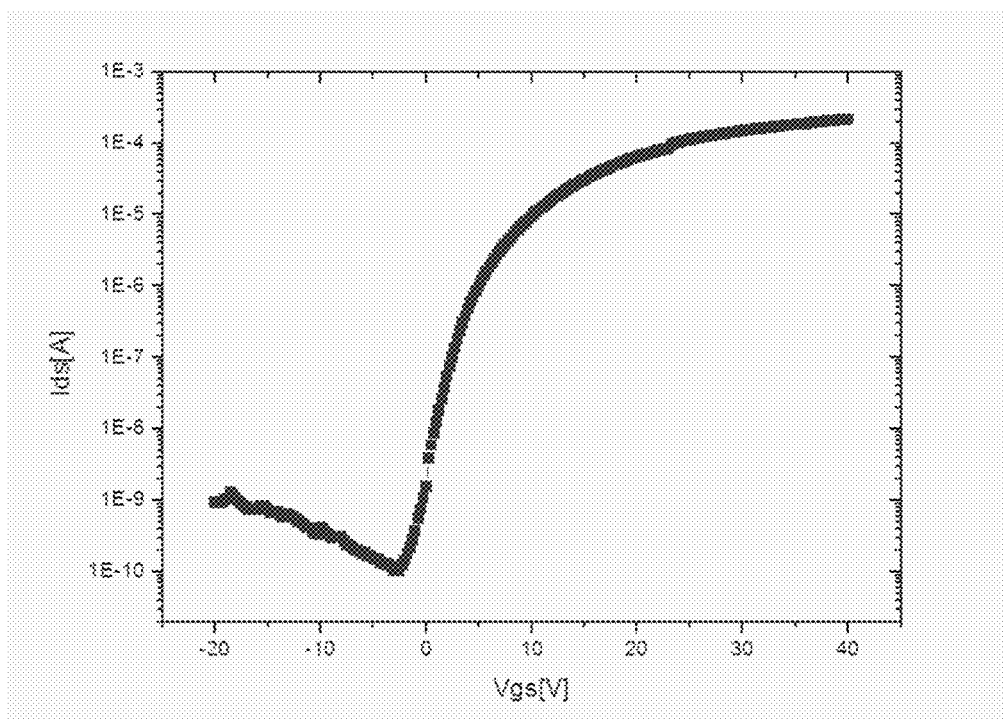
FIG. 10 is a plot of the transfer characteristic curve of a thin-film transistor manufactured with the method for manufacturing the thin-film transistor according to the present invention.
Figure 11:
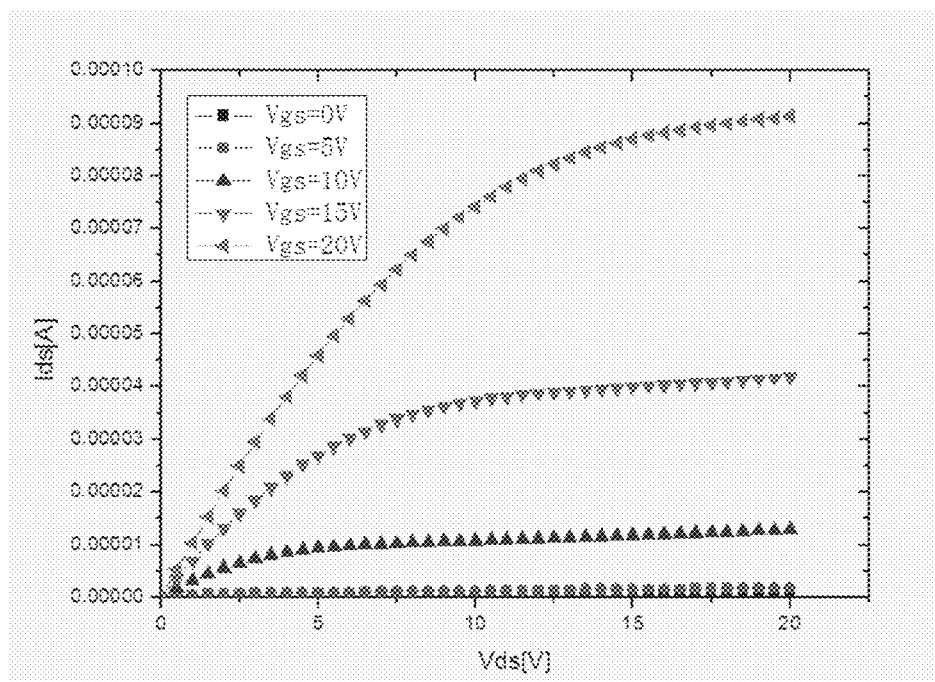
FIG. 11 is a plot of the output characteristic curves of a thin-film transistor manufactured with the method for manufacturing the thin-film transistor according to the present invention.

Referring to FIGS. 10 and 11, plots of characteristic curves of a thin-film transistor substrate manufactured with the method for manufacturing a thin-film transistor substrate according to the present invention are showed. It can be seen from the plots that no crowding effect resulting from excessive contact resistance is shown in the output characteristic curve. This indicates that the source/drain terminals and the oxide semiconductor layer of the thin-film transistor manufactured with the method of the present invention have excellent contact characteristic therebetween.

In summary, the present invention provides a method for manufacturing a thin-film transistor substrate, which has a simple process and achieves an excellent contact interface between an oxide semiconductor layer and source/drain terminals through successive film forming so as to prevent crowding effect resulting from excessive contact resistance. Further, by using a metallic material containing tantalum to make the source/drain terminals and applying an etchant solution containing hydrogen peroxide to carry out etching in an etching process of the source/drain terminals, damages of the oxide semiconductor layer caused by traditional etchant solution can be prevented and quality of the thin-film transistor substrate can be enhanced. Further, it is not necessary to additionally form an etch stopper layer to protect the oxide semiconductor layer in the back channel so as to achieve relatively high channel width/length ratio (W/L), and also simplify the structure of the thin-film transistor substrate, simplify the manufacturing process, reduce the manufacturing cost, and enhance yield rate.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A g method for manufacturing a thin-film transistor substrate, comprising the following steps:
   (1) providing a substrate;
   (2) forming a first metal layer on the substrate and patterning the first metal layer to form a gate terminal;
   (3) forming a gate insulation layer on the gate terminal and the substrate;
   (4) successively forming films on the gate insulation layer to sequentially form an oxide semiconductor layer and a second metal layer and patterning the second metal layer in such a way to leave separate parts of the second metal layer on the oxide semiconductor layer to form source/drain terminal, wherein the second metal layer is formed of a single material that comprises tantalum and the second metal layer is patterned through etching with an etchant solution comprising hydrogen peroxide that is active to the single material that comprises tantalum and inactive to the oxide semiconductor layer so as to allow the second metal layer to be etched while the oxide semiconductor layer preserved;
   (5) after patterning the second metal layer to form the source/drain terminal, patterning the oxide semiconductor layer to expose a portion of the gate insulation layer;
   (6) forming a passivation layer on the source/drain terminal, the oxide semiconductor layer, and the gate insulation layer and patterning the passivation layer to expose a portion of the source/drain terminals and a portion of the oxide semiconductor layer; and
   (7) forming a transparent conductive layer on the passivation layer and the exposed portion of the source/drain terminals and patterning the transparent conductive layer to form the pixel electrode.

2. The method for manufacturing the thin-film transistor substrate as claimed in claim 1, wherein the substrate is a transparent substrate.

3. The method for manufacturing the thin-film transistor substrate as claimed in claim 2, wherein the substrate is a glass substrate.

4. The method for manufacturing the thin-film transistor substrate as claimed in claim 1, wherein the first metal layer comprises at least one of copper, tantalum, aluminum, and molybdenum.

5. The method for manufacturing the thin-film transistor substrate as claimed in claim 1, wherein the second metal layer further comprises at least one of copper, aluminum, and molybdenum.

6. The method for manufacturing the thin-film transistor substrate as claimed in claim 1, wherein the etchant solution comprises hydrogen peroxide having a concentration greater than 5 wt % and less than 30 wt %.

7. The method for manufacturing the thin-film transistor substrate as claimed in claim 1, wherein the oxide semiconductor layer comprises at least one of indium oxide, zinc oxide, tin oxide, and gallium oxide.

8. The method for manufacturing the thin-film transistor substrate as claimed in claim 1, wherein the transparent conductive layer comprises indium tin oxide and the gate insulation layer and the passivation layer comprises silicon oxide.

9. A method for manufacturing a thin-film transistor substrate, comprising the following steps:
   (1) providing a substrate;
   (2) forming a first metal layer on the substrate and patterning the first metal layer to form a gate terminal;
   (3) forming a gate insulation layer on the gate terminal and the substrate;
   (4) successively forming films on the gate insulation layer to sequentially form an oxide semiconductor layer and a second metal layer and patterning the second metal layer in such a way to leave separate parts of the second metal layer on the oxide semiconductor layer to form source/drain terminal, wherein the second metal layer is formed of a single material that comprises tantalum and the second metal layer is patterned through etching with an etchant solution comprising hydrogen peroxide that is active to the single material that comprises tantalum and inactive to the oxide semiconductor layer so as to allow the second metal layer to be etched while the oxide semiconductor layer preserved;
   (5) after patterning the second metal layer to form the source/drain terminal, patterning the oxide semiconductor layer to expose a portion of the gate insulation layer;
   (6) forming a passivation layer on the source/drain terminal, the oxide semiconductor layer, and the gate insulation layer and patterning the passivation layer to expose a portion of the source/drain terminals and a portion of the oxide semiconductor layer; and
   (7) forming a transparent conductive layer on the passivation layer and the exposed portion of the source/drain terminals and patterning the transparent conductive layer to form the pixel electrode;
   wherein the substrate is a transparent substrate;
   wherein the substrate is a glass substrate; and
   wherein the first metal layer comprises at least one of copper, tantalum, aluminum, and molybdenum.

10. The method for manufacturing the thin-film transistor substrate as claimed in claim 9, wherein the second metal layer further comprises at least one of copper, aluminum, and molybdenum.

11. The method for manufacturing the thin-film transistor substrate as claimed in claim 9, wherein the etchant solution comprises hydrogen peroxide having a concentration greater than 5 wt % and less than 30 wt %.

12. The method for manufacturing the thin-film transistor substrate as claimed in claim 9, wherein the oxide semiconductor layer comprises at least one of indium oxide, zinc oxide, tin oxide, and gallium oxide.

13. The method for manufacturing the thin-film transistor substrate as claimed in claim 9, wherein the transparent conductive layer comprises indium tin oxide and the gate insulation layer and the passivation layer comprises silicon oxide.

* * * * *